US009574272B2

(12) United States Patent
Markovich et al.

(10) Patent No.: US 9,574,272 B2
(45) Date of Patent: Feb. 21, 2017

(54) METAL NANOWIRE THIN-FILMS

(75) Inventors: Gil Markovich, Tel Aviv (IL); Daniel Azulai, Rehovot (IL); Olga Krichevski, Ariel (IL)

(73) Assignee: RAMOT AT TEL-AVIV UNIVERSITY LTD, Tel-Aviv (IL)

( * ) Notice: Subject to any disclaimer, the term of this patent is extended or adjusted under 35 U.S.C. 154(b) by 625 days.

(21) Appl. No.: 13/061,745

(22) PCT Filed: Sep. 1, 2009

(86) PCT No.: PCT/IL2009/000842
§ 371 (c)(1),
(2), (4) Date: Mar. 2, 2011

(87) PCT Pub. No.: WO2010/026571
PCT Pub. Date: Mar. 11, 2010

(65) Prior Publication Data
US 2011/0162870 A1    Jul. 7, 2011

Related U.S. Application Data

(60) Provisional application No. 61/190,712, filed on Sep. 2, 2008.

(51) Int. Cl.
C23C 18/14      (2006.01)
C23C 18/44      (2006.01)
(Continued)

(52) U.S. Cl.
CPC .......... *C23C 18/14* (2013.01); *C23C 18/166* (2013.01); *C23C 18/1676* (2013.01); *C23C 18/34* (2013.01); *C23C 18/40* (2013.01); *C23C 18/44* (2013.01); *C23C 18/48* (2013.01); *H05K 3/105* (2013.01); *H05K 3/182* (2013.01); *H05K 2201/0257* (2013.01); *H05K 2203/013* (2013.01); *H05K 2203/1157* (2013.01); *H05K 2203/125* (2013.01)

(58) Field of Classification Search
CPC ....................................................... C23C 18/14
USPC ......................................................... 427/558
See application file for complete search history.

(56) References Cited

U.S. PATENT DOCUMENTS 5,294,370 A * 3/1994 Wickers et al. ............... 516/96
7,083,104 B1   8/2006 Empedocles et al.
(Continued)

FOREIGN PATENT DOCUMENTS

EP    2363891 A1    9/2011
WO    2010026571 A2   3/2010
WO    2010130986 A1   11/2010

OTHER PUBLICATIONS

Mortier, et al "Two-step synthesis of high aspect ratio gold nanorods", Central European Journal of Chemisty 4 (1) 2006, pp. 160-165.*

(Continued)

*Primary Examiner* — Katherine A Bareford
(74) *Attorney, Agent, or Firm* — Cantor Colburn LLP

(57) ABSTRACT

A conductive nanowire film based on a high aspect-ratio metal is disclosed. The nanowire film is produced by inducing metal reduction in a concentrated surfactant solution containing metal precursor ions, a surfactant and a reducing agent. The metal nanostructures demonstrate utility in a great variety of applications.

25 Claims, 6 Drawing Sheets

(51) Int. Cl.
*C23C 18/48* (2006.01)
*C23C 18/16* (2006.01)
*C23C 18/34* (2006.01)
*C23C 18/40* (2006.01)
*H05K 3/10* (2006.01)
*H05K 3/18* (2006.01)

(56) References Cited

U.S. PATENT DOCUMENTS

| | | | |
|---|---|---|---|
| 8,455,048 | B1 | 6/2013 | Fan |
| 9,373,515 | B2 | 6/2016 | Markovich et al. |
| 2006/0196309 | A1* | 9/2006 | Niidome et al. ............... 75/345 |
| 2006/0267595 | A1 | 11/2006 | Bohannan et al. |
| 2007/0077187 | A1* | 4/2007 | Kirkegaard ................. 423/23 |
| 2008/0088219 | A1 | 4/2008 | Yoon |
| 2008/0143906 | A1 | 6/2008 | Allemand et al. |
| 2008/0286447 | A1 | 11/2008 | Alden et al. |
| 2009/0130433 | A1 | 5/2009 | Takada |
| 2011/0253668 | A1 | 10/2011 | Winoto et al. |

OTHER PUBLICATIONS

Kuo, et al "Synthesis of Branched Gold Nanocrystals by a Seeding Growth Approach", Langmuir, vol. 21, No. 5, 2005, pp. 2012-2016.*
Niidome, et al "Rapid synthesis of gold nanorods by the combination of chemical reduction and photoirradiation processes; morphological changes depending on the growing processes", Chem. Commun. 2003, pp. 2376-2377.*
Hubert, et al "Cetyltrimethylammonium Bromide Silver Bromide Complex as the Capping Agent of Gold Nanorods", Langmuir, vol. 24, No. 17, 2008, pp. 9219-9222.*
Zijlstra, et al "High-Temperature Seedless Synthesis of Gold Nanorods", J. Phys. Chem. B, vol. 110, No. 39, 2006, pp. 19315-19318.*
The Free Dictionary, definition of "several", thefreedictionary.com, accessed Mar. 29, 2016, 4 pages.*
Jung-Yong Lee, "Solution-Processed Metal Nanowire Mesh Transparent Electrodes", Nano Letters. 8, 689-692 (2008).
Kang, M. G., "Organic Solar Cells Using Nanoimprinted Transparent Metal Electrodes", Advanced. Materials. 20, 4408-4413 (2008).
Hellstrom, S. L.,"Polymer-Assisted Direct Deposition of Uniform carbon nanotube bundle networks for high performance transparent Electrodes", ACS Nano, 3, 1423-1430 (2009).
Lu, X., "Ultrathin Gold Nanowires Can Be Obtained by Reducing Polymeric Strands of Oleylamin-AuCl Complexes Formed via Aurophilic Interaction", J. Am. Chem. Soc. 130, 8900-8901 (2008).
Wang, C.,"Ultrathin Au Nanowires and Their Transport Properties", J. Am. Chem. Soc., 130, 8902-8903 (2008).
Pazos-Perez N., "Synthesis of Flexible, Ultrathin Gold Nanowires in Organic Media", Langmuir, 24, 9855-9860 (2008).
Krichevski, O., "Formation of Gold-Silver Nanowires in Thin Surfactant Solution Films, Langmuir", 22, 867-870 (2006).
Krichevski, O., "Growth of Au/Ag nanowires in thin surfactant solution films: an electron microscopy study" J. Colloid Interface Sci. 314, 304 (2007).
Krichevski, O., "Growth of Colloidal Gold Nanostars and Nanowires Induced by Palladium Doping" Langmuir 23, 1496-1499 (2007).
Jana, N. R., "Wet Chemical Synthesis of High Aspect Ratio Cylindrical Gold Nanorods", J. Phys. Chem. B 105, 4065 (2001).
Jana, N. R., "Liquid crystalline assemblies of ordered gold nanorods", J. Mater. Chem. 12, 2909-2912 (2002).
Xiuwen Zheng, "Controlling synthesis of silver nanowires and dendrires in mixed surfactant solutions", Journal of Colloid Interface Science 268 (2003) 357-361.
Catherine J. Murphy, "One-Dimensional Colloidal Gold and Silver Nanostructures" Inorganic Chemistry (2006) 45, 7544-7554.

Ziyang Huo, " Sub-two Nanometer Single Crystal au Nanowires" Nano Letters (2008) vol. 8, No. 7 2041-2044.
Tom Mortier, "An experimental study on the preparation of gold nanoparticles and their properties" May 2006, XP002578469, Internet.
International Search Report PCT/IL2009/000842; Dated Aug. 30, 2010.
Ahn et al.; "Transparent conductive grids via direct writing of silver nanoparticle inks"; Nanoscale, vol. 3; 2011; pp. 2700-2702.
Azulai et al.; "On-Surace Formation of Metal Nanowire Transparent Top Electrodes on CdSe Nanowire Array-Based Photoconductive Devices"; ACS Publications, vol. 4, No. 6; 2012; pp. 3157-3162.
Azulai et al.; "Seed Concentration Control of Metal Nanowire Diameter"; NANO Letters, vol. 12, No. 11; 2012 pp. 5552-5558.
Azulai et al.; "Transparent Metal Nanowire Thin Films Prepared in Mesostructured Templates", Nano Letters, vol. 9, No. 12; Oct. 23, 2009; pp. 4246-4249.
Belenkova et al.; "UV induced formation of transparent Au—Ag nanowire mesh film for repairable OLED devices"; Journal of Materials Chemistry, vol. 22; 2012; pp. 24042-24047.
De et al.; "Silver Nanowire Networks as Flexible, Transparent, Conducting Films: Extemely High DC to Optical Conductivity Ratios"; ACS Nano, vol. 3, No. 7; 2009; pp. 1767-1774.
Hu et al.; "Scalable Coating and Properties of Transparent, Flexible, Silver Nanowire Electrodes"; ACS Nano, vol. 4, No. 5; 2010; pp. 2955-2963—Abstract only.
Huo et al.; "Sub-Two Nanometer Single Crystal Au Nanowire"; Nano Lett., vol. 8, No. 7; 2008; pp. 2041-2044—Abstract only.
International Search Report for International Application No. PCT/IL2013/050184; International Filing Date Feb. 28, 2013; Date of Mailing May 28, 2013; 10 pages.
Kang et al.; "Nanoimprinted Semitransparent Metal Electrodes and Their Application in Organic Light-Emitting Diodes"; Advanced Materials, vol. 19; 2007; 1391-1396.
Kumar et al.; "The Race to Replace Tin-Doped Indium Oxide: Which Material Will Win?"; ACS Nano, vol. 4, No. 1; 2010; pp. 11-4.
Layani et al.; "Flexible transparent conductive coatings by combining self-assembly with sintering of silver nanoparticles performed at room temperature"; Journal of Materials Chemistry, vol. 21; 2011; pp. 15378-15382.
Lee et al.; "Control of Current Saturation and Threshold Voltage Shift in Indium Oxide Nanowire Transistors with Femtosecond Laser Annealing"; ACS Nano, vol. 5, No. 2; 2011; pp. 1095-1101—Abstract only.
Lee et al.; "Solution-Processed Metal Nanowire Mesh Transparent Electrodes"; Nano Letters, vol. 8, No. 2; 2008; pp. 639-692.
Lu et al.; "Continuous formation of supported cubic and hexagonal mesoporous films by sol-gel dp-coating"; Nature, vol. 389; Sep. 25, 1997; pp. 364-368.
Lyons et al.; "High-Performance Transparent Conductors from Networks of Gold Nanowires"; J. Phys. Chem. Lett., vol. 2; 2011; pp. 3058-3062—Abstract only.
Nagai et al.; "Electric Conductivity-Filled Polymer Composites: Orientation Control of Nanowires in a Magnetic Field"; ACS Appl. Mater. Interfaces, vol. 3, No. 7; 2011; pp. 2341-2348—Abstract only.
Perez-Juste et al.; "Electric-Field-Directed Growth of Gold Nanorods in Aqueous Surfactant Solutions"; Advanced Functional Materials, vol. 14, No. 6; 2004; pp. 571-579.
Rathmell et al.; "The growth mechanism of copper nanowires and their properties in flexible, transparent conducting films"; Advanced Materials, vol. 22; 2010; pp. 3558-3563.
Rathmell et al.; "The Synthesis and Coating of Long, Thin Copper Nanowires to Make Flexible, Transparent Conducting Films on Plastic Substrates"; Advanced Materials, vol. 23; 2011; pp. 4798-4803.
Reddy et al.; "Synthesis and cathodoluminescence properties of CdSe/ZnO hierarchical nanostructures"; Journal of Materials Chemistry, vol. 21; 2011, pp. 3858-3864.
Stawinski et al., "Synthesis and Alignment of Silver Nanorods and Nanowires and the Formation of Pt, Pd, and Core/Shell Structures

(56) References Cited

OTHER PUBLICATIONS by Galvanic Exchange Directly on Surfaces"; Langmuir, vol. 23, No. 20; 2007; pp. 10357-10365; Abstract only.

Taub et al.; "Growth of Gold Nanorods on Surfaces"; Journal Phys. Chem. B, vol. 107, No. 45; pp. 11579-11582.

Tvingstedt et al.; "Electrode Grids for ITO Free Organic Photovoltaic Devices"; Advanced Materials, vol. 19; 2007; pp. 2393-2397.

Wang et al.; "Ultrathin Au Nanowires and Their Transport Properties" J. Am. Chem. Soc., vol. 130, No. 28; 2008; pp. 8902-8903—Abstract only.

Wang et al.; "Facile Synthesis of Ultrathin and Single-Crystalline Au Nanowires"; Chemistry—An Asian Journal; Jul. 6, 2009; pp. 1028-1034—Abstract only.

Written Opinion for International Application No. PCT/IL2013/050184; International Filing Date February 28, 2013; Date of Mailing May 28, 2013; 8 pages.

Zeng et al.; "A New Transparent Conductor: Silver Nanowire Film Buried at the Surface of a Transparent Polymer"; Advanced Materials, vol. 22; 2010; pp. 4484-4488.

Zhu et al.; "Reductive-Oxidation Electrogenerated Chemiluminescence (ECL) Generation at a Transparent Silver Nanowire Electrode"; Langmuir, vol. 27, No. 6; 2011; pp. 3121-3127—Abstract only.

Zhu et al.; "Transparent Conductors from Carbon Nanotubes LBL—Assembled with Polymer Dopant with $\pi$—$\pi$ Electron Transfer"; J. Am. Chem. Soc., vol. 133, No. 19; 2011; pp. 7450-7460—Abstract only.

\* cited by examiner

Fig. 5A    Fig. 5B
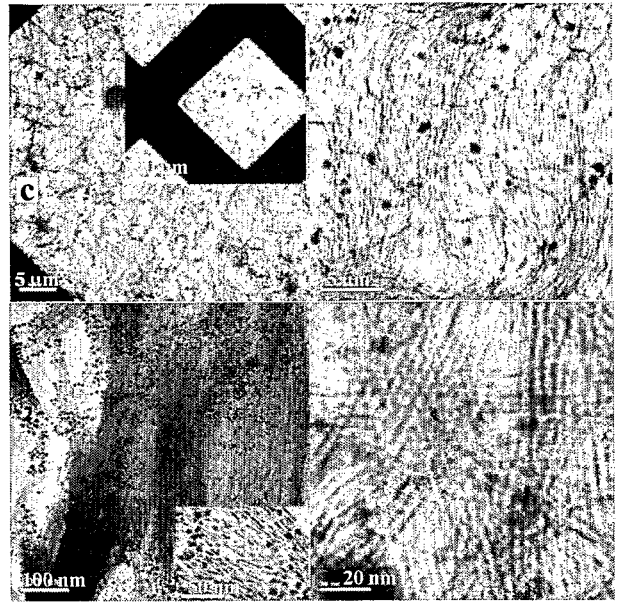
Fig. 5C    Fig. 5D
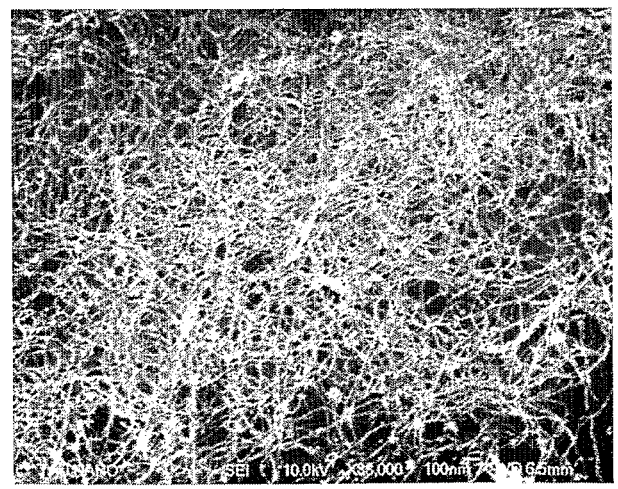
Fig. 6

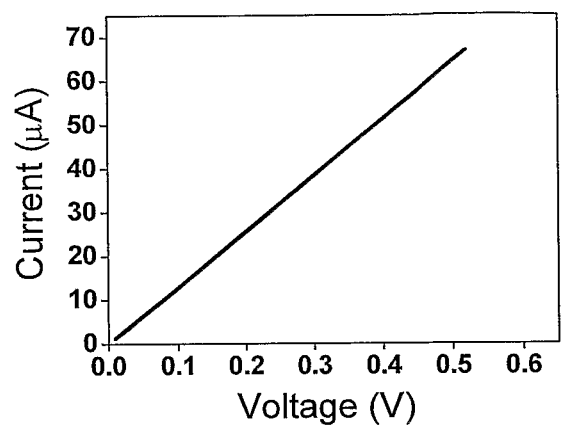
Fig. 7A
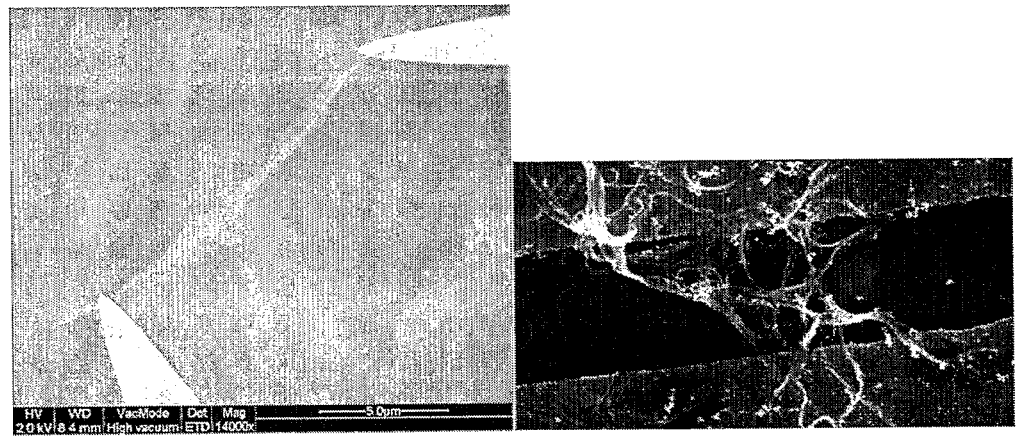
Fig. 7B
Fig. 7C
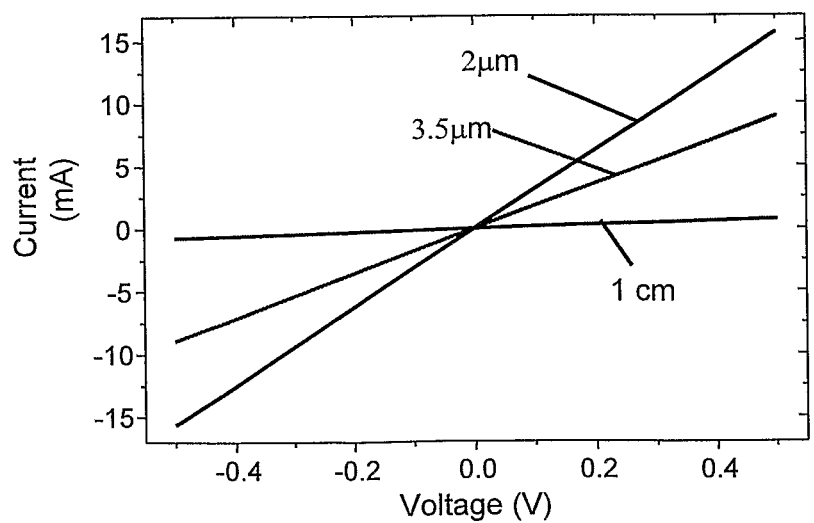
Fig. 7D

METAL NANOWIRE THIN-FILMS

FIELD OF THE INVENTION

This invention relates to the formation of metal nanowire thin-films.

BACKGROUND OF THE INVENTION

Applications of thin, transparent and electrically conducting films are numerous. The most attractive application is as a transparent electrode for low-cost photovoltaics and other opto-electronic applications. Light emitting devices often require such electrodes, in particular, large area displays. Currently, the existing technology uses conducting metal oxide films, primarily indium-tin oxide (ITO) and doped zinc oxide for these applications. These films have a limited transparency/conductivity trade-off and are produced by expensive vacuum deposition techniques. Such films are also hard and brittle and may therefore be unsuitable for flexible coatings such as plastic electronics. A flexible alternative that has been considered is a film of a conducting polymer, but such films are much less conductive and more sensitive to radiation and chemical attack and would thus not be good candidates for ITO replacement.

In recent years, there is a growing interest in finding alternatives for these transparent oxide electrodes. The primary candidates have been carbon nanotube-based electrodes. However, such films could not exceed the performance of ITO films in terms of conductivity vs. visible light transmittance. There are several problems in producing highly conductive, transparent carbon nanotube mesh films. The limited solubility of the tubes makes it difficult to disperse them in various solvents for efficient coating applications. To produce such dispersions, high molecular weight polymer surfactants are required, which produce an insulating or semiconducting layer [1] around the nanotubes and thus significantly increase the inter-tube contact resistance.

Another alternative is to use pure carbon nanotube meshes or fabrics for this purpose, but here the nanotube density is too high and optical transmission is degraded, and it is thus difficult to integrate such meshes into thin-film devices. The same difficulties hold for other types of prefabricated nanowires made of various oxides and semiconductors.

Recently, thin conducting films consisting of high aspect ratio nanostructures have been suggested as a substitute for metal oxide based transparent electrodes, particularly in combination with conducting polymer based devices [2, 3, 4]. Such films, made of metallic nanowires have high conductivity while maintaining a metal volume fraction as low as ~1% and thus are highly transparent.

Many schemes of synthesizing conducting and semiconducting nanowires were developed in the last 15 years. A very high control level of the nanowires geometry and composition, including modulation of compositions along or across the nanowires, has been achieved. A control over the position and orientation of the nanowire growth has been achieved in catalytic growth of carbon nanotubes and semiconductor nanowires by positioning of the catalyst particles at selected places. However, the task of forming uniform thin films of such elongated nano-objects to obtain highly conductive meshes over large areas has been more difficult to achieve. High molecular weight polymeric surfactants are required for dispersing the nanowires/nanotubes in various solvents. These polymers usually form insulating barriers over the nanowires, which would then require annealing to reduce inter-wire electrical resistance [2], unless the polymer itself is (semi-)conducting [1, 4].

Peumans et al., have recently published a first calculation and demonstration of a random silver nanorods mesh electrode as a replacement for a metal oxide film in a polymer based solar cell [2]. Peumans et al used prefabricated silver nanorods with an average aspect ratio of ~84, coated by a high molecular weight polymer and dispersed in a solvent to prepare the thin conductive film. The film required substantial annealing to reduce the contact resistance between the nanorods, which probably was the primary factor limiting the performance of this film. The film, with comparable transmittance and conductivity to an ITO film, exhibited 19% higher photocurrent when used for the polymer solar cell compared to the ITO analog.

Gold nanowires have also been prepared in oleylamine, employing a variety of methods.

REFERENCES

[1] US patent application no. 20080088219, Transparent carbon nanotube electrode using conductive dispersant, Yoon, S. M. et al., 13 Apr. 2007.
[2] Lee, J-Y., Connor, S., T. Cui, Y., Peumans, P., *Solution-Processed Metal Nanowire Mesh Transparent Electrodes*, Nano Lett. 8, 689-692 (2008).
[3] Kang, M. G., Kim, M. S., Kim, J., Guo, L. J., *Organic Solar Cells Using Nanoimprinted Transparent Metal Electrodes*, Adv. Mater. 20, 4408-4413 (2008).
[4] Hellstrom, S. L., Lee, H. W., Bao, Z., *Polymer Assisted Direct Deposition of Uniform carbon nanotube bundle networks for high performance transparent Electrodes*, ACS Nano, 3, 1423-1430 (2009).
[5] Lu, X., Yavuz, M. S., Tuan, H-Y., Korgel, B. A., Xia, Y., *Ultrathin Gold Nanowires Can Be Obtained by Reducing Polymeric Strands of Oleylamin-AuCl Complexes Formed via Aurophilic Interaction*, J. Am. Chem. Soc. 130, 8900-8901 (2008).
[6] Wang, C., Hu, Y., Lieber, C. M., Sun, S., *Ultrathin Au Nanowires and Their Transport Properties*, J. Am. Chem. Soc., 130, 8902-8903 (2008).
[7] Huo, Z., Tsung, C-K., Huang, W., Zhang, X., *Sub-Two Nanometer Single Crystal Au Nanowires*, Nano Lett., 8, 2041-2044 (2008).
[8] Pazos-Perez, N., Baranov, D., Irsen, S., Hilgendorff, M., Liz-Marazan, L. M., Giersing, M., *Synthesis of Flexible, Ultrathin Gold Nanowires in Organic Media*, Langmuir, 24, 9855-9860 (2008).
[9] Krichevski, O., Tirosh, E., Markovich, G., *Formation of Gold-Silver Nanowires in Thin Surfactant Solution Films*, Langmuir 22, 867-870 (2006).
[10] Krichevski, O., Levi-Kalisman, Y., Szwarcman, D., Lereah, Y., Markovich, G., *Growth of Au/Ag nanowires in thin surfactant solution films: an electron microscopy study*, J. Colloid Interface Sci. 314, 304 (2007).
[11] Krichevski, O., Markovich, G., *Growth of Colloidal Gold Nanostars and Nanowires Induced by Palladium Doping*, Langmuir 23, 1496-1499 (2007).
[12] Jana, N. R., Gearheart, L., Murphy, C. J., Wet Chemical Synthesis of High Aspect Ratio Cylindrical Gold Nanorods, J. Phys. Chem. B 105, 4065 (2001).
[13] Jana, N. R., Gearheart, L. A., Obare, S. O., Johnson, C. J., Edler, K. J., Mann, S., Murphy, C. J., *Liquid crystalline assemblies of ordered gold nanorods*, J. Mater. Chem. 12, 2909-2912 (2002).

SUMMARY OF THE INVENTION

The inventors of the present application, in their pursuit to improve on the deficiencies of the art have developed a finer, higher aspect-ratio (above 1000) homogeneous highly conductive mesh of metal nanowires. The manufacture of these nanowires employed a solution-process whereby the metal nanowires are formed from a solution of metal precursors, which slowly dries into a mesh of nanowires with controllable surface coverage. These metal nanowires made of a metal such as gold, silver, copper, nickel, palladium, and combinations thereof, significantly out-perform many of the nanowires known in the literature, including the silver nanorod and ITO films of the art, by having at least one order of magnitude better conductivity, for visible light transmission levels of 80-90% regularly achieved in such films, e.g., ITO films.

This invention is, thus, generally concerned with a process for the preparation of a conductive nanowire film (herein referred to as a nanowire film) based on a high aspect-ratio metal, e.g., gold nanowires. The nanowire film is produced by inducing metal reduction in a concentrated surfactant solution containing metal precursor ions, at least one surfactant and at least one reducing agent, forming a thin-film thereof on a surface of a substrate and allowing the film to dry. The metal nanostructures begin forming in the concentrated surfactant solution that progressively becomes more concentrated as the film dries.

The nanowire film, thus obtained, has metallic conductivity and high transparency to light due to the low volume filling of the metal in the film. These nanowire films find use as transparent electrodes for photovoltaic and other optoelectronic devices (e.g., photovoltaic and light emitting diode devices), as will be further disclosed hereinbelow. The processes of the invention for manufacturing nanowire films are suitable for printing conducting patterns on various surfaces using a great variety of techniques such as ink jet printing.

Thus, in one aspect of the present invention there is provided a process for the preparation of a nanowire film on a surface of a substrate, said process comprising:

(a) obtaining an aqueous precursor solution comprising at least one metal precursor, at least one surfactant and at least one metal reducing agent wherein the concentration of the at least one surfactant in said solution is at least 5% (w/w);

(b) forming a thin-film of the precursor solution, i.e., of step (a), on at least a portion of a surface of a substrate; and (c) allowing nanowires to form in said thin-film, on a portion of said surface, e.g., by allowing the thin film to dry; thereby obtaining a nanowire film on at least a portion of said surface.

In some embodiments, the nanowire is conductive.

In certain embodiments, the process of the invention comprises a step of pre-treating the surface of the substrate to prepare it to better receive the deposition of the solution.

The pre-treatment may include, in a non-limiting fashion, solvent or chemical washing (e.g., by a non-liquid medium such as a gas), etching, heating, deposition of an optionally patterned intermediate layer to present an appropriate chemical or ionic state to the nanowire formation, as well as further surface treatments such as plasma treatment, UV-ozone treatment, or corona discharge.

In certain embodiments, the process further comprises the step of post-treating the resulting conductive nanowire film. In some embodiments, the post-treatment involves at least one of washing the conductive nanowire film with an aqueous or organic liquid or solution to e.g., remove excess surfactant, and thermally treating the film, e.g., at a temperature not exceeding 100° C.

The aqueous solution comprising the at least one metal precursor, at least one surfactant and at least one metal reducing agent, herein referred to as the precursor solution, may be prepared by forming a solution or a mixture (by mixing, admixing) of the components together at a temperature which permits complete dissolution of the components in each other or in an inert medium (such as water), permitting formation of a substantially homogenous solution. It should be noted, that the term "solution" should be given its broadest definition to encompass a liquid state in which one component is fully dissolved in another or in a liquid medium, a liquid state of emulsion (nano- or microemulsion) of one or more components of the precursor solution in another or in a medium, and a state of dispersion (nano- or microdispersion) of one or more components of the precursor solution in another or in a medium. In some embodiments, the precursor solution is a homogenous nano- or micro-emulsion.

The precursor solution is prepared, in some embodiments, by combining (mixing, admixing) the components at room temperature. In some other embodiments the mixing is carried out at a temperature above room temperature, e.g., in different embodiments the temperature is between 25-100° C., between 25-75° C., between 30-50° C., between 30-40° C., between 40-75° C., or between 50-75° C.

In some embodiments, the precursor solution is prepared by first forming a solution of at least two of the components, e.g., the at least one first metal precursor and at least one surfactant at a temperature allowing dissolution of one component in the other, or both components in an inert medium such as water (or another medium which permits their dissolution or emulsification), followed by the addition (e.g., by way of admixing) of the at least one other component, e.g., reducing agent and/or at least one second metal precursor, while maintaining the temperature so as to sustain a substantially homogenous solution.

In some embodiments, the aqueous precursor solution is prepared by first forming a solution of at least one first metal precursor, at least one surfactant and at least one second metal precursor at a temperature allowing dissolution, followed by the addition of at least one reducing agent.

In some embodiments, the aqueous precursor solution is prepared by first forming a solution of at least one first metal precursor, at least one surfactant, at least one reducing agent and at least one second metal precursor at a temperature allowing dissolution, followed by the addition of at least one second reducing agent.

The process of the invention is suitable for the preparation of a great variety of conductive metal nanowires. The metal nanowires may be of gold, silver, copper, nickel, palladium, platinum or combinations thereof. The at least one metal precursor is thus a metal precursor containing the element (in any form, e.g., ionic or non-ionic) making up the nanowire. Typically, the metal precursor is in the form of metal ions or in a form which under the reaction conditions dissociates into metal ions. Non-limiting examples of metal precursors are chloroauric acid, $HAuCl_4$, as a source of gold; $AgNO_3$ as a source of silver; $(NH_4)_2PdCl_6$ as a source of palladium; $Cu(NO_3)_2$ as a source of copper; $NiCl_2$ as a source of nickel; and $H_2PtCl_6$ as a source of platinum.

In some embodiments, the at least one metal precursor is a single metal precursor. In other embodiments, the at least one metal precursor is a combination of two or more metal precursors or the same metal or of different metals.

In some embodiments, the metal precursor is a gold precursor, such as chloroauric acid. In other embodiments, the metal precursor is a combination of gold and silver metal precursors. In still further embodiments, the metal precursor is a combination of palladium, silver and/or gold metal precursors.

The metal precursor concentration is about at least 1 mM. In some embodiments, the concentration is between 1 and 15 mM. In other embodiments, the concentration is between 1 and 10 mM.

The at least one surfactant may be a single surfactant or a mixture of two or more surfactants. The at least one surfactant is typically selected amongst cationic-type surfactants, typically quaternary ammonium based molecules, such as those having at least one alkyl chain of 10 or more carbon atoms; in some embodiments of at least 14 carbon atoms, e.g., 14, 16 or 18 carbon atoms. In some embodiments, the at least one surfactant has one alkyl chain of between 14 and 16 carbon atoms. In other embodiments, the at least one surfactant is a multi-chain surfactant having two or more alkyl chains, each of between 10 and 16 carbon atoms.

Non-limiting examples of said surfactant are cetyltrimethylammonium bromide (CTAB), didodecyldimethylammonium bromide, tetradecyltrimethylammonium bromide, didecyldimethylammonium bromide, wherein the bromide counterion, alternatively, may be a chloride or an iodide.

In some embodiments, the concentration of the at least one surfactant is above 5%, in further embodiments above 10%, in still other embodiments above 15%, and in yet other embodiments, the concentration is above 20%. In some additional embodiments, the surfactant concentration is at most 30%. In additional embodiments, the surfactant concentration is between 7.5 and 21%.

It should be noted that where various embodiments are described by using a given range, the range is given as such merely for convenience and brevity and should not be construed as an inflexible limitation on the scope of the invention. Accordingly, the description of a range should be considered to have specifically disclosed all the possible sub-ranges as well as individual numerical values within that range. For example, an alkyl chain having between 10 and 16 carbon atoms should be considered to have specifically disclosed sub-ranges such as from 10 to 13, from 10 to 14, from 10 to 15, from 11 to 13, from 11 to 14, from 11 to 15, from 11 to 16, from 12 to 14, from 12 to 15, etc., as well as individual numbers within that range, for example, 10, 11, 12, 13, 14, 15, and 16.

The at least one reducing agent employed in the precursor solution is an agent capable of reducing the at least one first and/or second metal precursors. In some embodiments, the metal reducing agent is inorganic and in other embodiments, the metal reducing agent is an organic agent. Non-limiting examples of such reducing agents are metal borohydride, e.g., such as sodium borohydride and other hydride derivatives, such as cyanoborohydride, sodium ascorbate, hydroquinone and hydroquinone derivatives, hydrazine and hydrazine derivatives, such as methylhydrazine and any combinations thereof.

In some embodiments, the at least one reducing agent is two or more agents introduced into the reaction mixture at the same time or at different times. In some embodiments, the two or more reducing agents are different in their reducing ability; the first may be a weak reducing agent such as sodium ascorbate and the second may be a strong reducing agent such as a metal borohydride.

As the process of the method recites, upon formation of the precursor solution, the solution or an aliquot thereof is placed on at least a portion of the surface to be coated (which had optionally been pre-treated) and a thin-film is allowed to form thereon. To enable the deposition of the precursor solution with a controlled thickness and uniformity over the surface, different techniques may be employed depending on the size of the surface, its structure, viscosity of the solution (as derived for example by the specific surfactant concentration), the temperature of the precursor solution, and other parameters as may be known to a person skilled in the art. Generally, for lower surfactant (low viscosity) solutions containing 1-15% surfactant (w/w) spray coating may be used, by employing, for example, a spray coating system having a high pressure nebulizer and a temperature controlled substrate holder. Such precursor solutions may also be applied onto the surface by employing the ink-jet printing technology and the roller printing technique known in the art. For higher surfactant concentrations of above 15% (w/w), drop casting, dip- and spin-coating techniques and roller printing techniques are also suitable for covering large surfaces.

The thickness of the thin-film depends on the viscosity, as determined by the surfactant concentration and temperature, of the precursor solution. Notwithstanding, the spread thickness typically employed is between 10 and 100 μm.

The surface of a substrate or an object on which the thin-film is formed according to the process of the present invention may be of any rigid or flexible substrate or object. The substrate can be clear (transparent; any degree of transparency) or opaque. The surface may be hydrophobic or hydrophilic in nature (or at any degree of hydrophobicity/hydrophilicity or a surface which may be switched between the two states). The surface may be an organic or inorganic surface such as a silicon surface (such as a standard, polished silicon wafer), a fused silica surface (such as a standard fused silica window polished to optical quality), a carbon surface (such as a highly oriented pyrolitic graphite), a surface of a relatively smooth polymer sheet (such as polycarbonate copying machine transparency film and a semiconducting polymer layer comprising the active layer of an organic light emitting diode made, for example from MEH-PPV or doped polyacetylene), and any other surface.

The surface may be whole surface or a portion thereof. The portion (region) of the substrate's surface to be coated may be of any size and structure, the portion may be continuous or comprise of several non-continuous sub-regions on the surface. In some embodiments, the surface of the substrate is substantially two-dimensional. In other embodiments, the surface is that of a three-dimensional object. In other embodiments, the at least one portion of the substrate's (or object's) surface is its whole surface.

Once the surface is covered, partially or wholly, with a thin-film of the precursor solution, it is allowed to dry. Unlike processes of the art, the drying of thin-film produced by the process of the present invention does not require high temperature. In some embodiments, the thin-film of the invention is allowed to dry at ambient temperature, i.e., between 25-27° C. In other embodiments, drying is achieved at a temperature not exceeding 40° C. In further embodiments, drying is achieved at a temperature between 27-40° C. In still other embodiments, drying is achieved at a temperature between 35-40° C.

The drying period does not typically exceed 60 minutes. In some embodiments, the thin-film is dried over a period of between 30-60 minutes, in other embodiments, between 30-45 minutes and in further embodiments over a period of up to 30 minutes (e.g., 1, 5, 7, 10, 15, 17, 20, 22, 25, 27 minutes or any period therebetween).

In some embodiments, nanowire formation may be induced (initiated), accelerated or generally controlled (controlling the morphology of the nanowires, their formation, their length, aspect ratio, bundle formation, accelerating their formation, arresting their formation, etc) by irradiating the film of the precursor solution (on at least a portion of the surface of a substrate) with ultraviolet light (UV). In some embodiments, the film is irradiated with a UV light at 254 nm (e.g., mercury lamp). The exposure duration may be from a few seconds to a few hours depending on the thickness of the film, the concentration of the surfactant, the temperature of the film, the size of the substrate and other factors.

In some embodiments, the film is exposed to a 100 W mercury lamp, in some embodiments, for 1-30 minutes.

The processes of the invention may be compatible with large scale deposition techniques, such as roll-to-roll printing. This process may allow better control of the nanowire dimensions and densities as well as reduction of the residual spherical nanoparticle population which is detrimental for the optical transmission properties of the films. Due to the directionality of the nanowire bundles of the invention, as will be further disclosed hereinbelow, they may be aligned using various alignment techniques used for liquid crystals, such as the use of external fields or shear forces. Such aligned nanowire arrays may be useful for future nanoelectronic circuits.

The present invention, in another of its aspects provides an aqueous solution (e.g., the homogeneous precursor aqueous solution, emulsion or dispersion) comprising at least one metal precursor (e.g., at least one salt of a metal selected from gold, silver, copper, palladium, platinum or a mixture thereof), at least one surfactant and at least one reducing agent, wherein the concentration of the at least one surfactant in said solution is at least 5% (w/w), and wherein each of the components is as defined hereinabove.

In some embodiments, the concentration of the at least one surfactant is above 5%, in further embodiments above 10%, in still other embodiments above 15%, and in yet other embodiments, the concentration is above 20%. In some additional embodiments, the surfactant concentration is at most 30%. In additional embodiments, the surfactant concentration is between 7.5 and 21%.

In some embodiments, the medium is water, preferably pure water, e.g., double distilled, triply distilled, or ultrapure. In other embodiments, the at least one metal precursor is gold and/or silver.

In still other embodiments, the solution (e.g., precursor solution) of the invention is at a temperature at which the solution is substantially homogeneous. Such a temperature, as disclosed above, may be ambient or a higher temperature.

In some embodiments, where the at least one metal reducing agent is sodium ascorbate, the surfactant concentration is at least 1%.

In further embodiments, the solution of the invention is for use in a process for the preparation of a conductive thin-film as disclosed herein.

In another aspect of the present invention, there is provided a process for the preparation of a nanowire film on a surface of a substrate, said process being independent of a surfactant concentration, said method comprising:
  (a) obtaining an aqueous precursor solution, said solution being prepared by:
    (i) combining (forming a solution of) at least one surfactant, at least one (first) metal precursor and at least one metal reducing agent in an aqueous medium;
    (ii) inducing metal reduction of said at least one metal precursor;
  (b) forming a thin-film of the solution of step (a) on at least a portion of a surface of a substrate; and
  (c) allowing nanowires in said thin-film to form, e.g., by drying the thin film;
  thereby obtaining a nanowire film (e.g., a conductive film) on at least a portion of said surface.

In some embodiments, the reduction of the at least one first metal precursor (a first metal precursor) is induced by the addition of at least one second metal precursor. In some embodiments, said at least one second metal precursor is a silver metal precursor.

In further embodiments, the at least one first metal precursor is a gold metal precursor and the aqueous precursor solution is obtained by:
  (i) forming a solution of at least one surfactant, at least one gold metal precursor and at least one metal reducing agent in an aqueous medium;
  (ii) adding into the aqueous solution at least one silver metal precursor to thereby induce reduction of said at least one gold metal precursor.

In other embodiments, the metal reducing agent is sodium ascorbate.

In yet additional embodiments of this process of the invention, the concentration of said at least one surfactant is between 1% and 10% (w/w) of the total weight of the precursor solution. In some embodiments, the concentration is between 1% and 5%. In other embodiments, the concentration is between 1% and 3%. In other embodiments the concentration is between 1% and 2%. In still further embodiments, the surfactant concentration is 1.6% (w/w).

There is thus provided a process for the preparation of a conductive nanowire film on a surface of a substrate, said process comprising:
  (a) obtaining an aqueous precursor solution, said solution being prepared by:
    (i) forming a solution of at least one surfactant at a concentration of between 1-10% (w/w), at least one gold metal precursor and sodium ascorbate in an aqueous medium;
    (ii) adding at least one silver metal precursor
  (b) forming a thin-film of the solution of step (a) on at least a portion of a surface of a substrate; and
  (c) allowing said thin-film to dry;
  thereby obtaining a gold/silver nanowire film on at least a portion of said surface.

As stated hereinabove, in some embodiments, the precursor solution is prepared by first forming a solution of at least one first metal precursor, at least one surfactant and at least one second metal precursor at a temperature allowing dissolution, followed by the addition of at least one reducing agent. In such embodiments, the process of the invention, being independent of a surfactant concentration, comprises:
  (a) obtaining an aqueous precursor solution, said solution being prepared by:
    (i) combining (forming a solution of) at least one surfactant, at least one first metal precursor, at least one reducing agent, and at least one second metal precursor in an aqueous medium;
    (ii) introducing at least one second reducing agent, to induce reduction of said at least one first metal precursor;
  (b) forming a thin-film of the solution of step (a) on at least a portion of a surface of a substrate; and
  (c) allowing said thin-film to dry;
  thereby obtaining a nanowire film on at least a portion of said surface.

In these embodiments, the reduction of the at least one first metal precursor is induced by the addition of the at least one second reducing agent after a solution has been formed of the first and second metal precursors and first reducing agent and the at least one surfactant.

The reducing agents employed are typically a hydride or metal borohydride and sodium ascrobate.

In further embodiments, the at least one first metal precursor is a gold metal precursor and the at least one second metal precursor is silver.

As above, the concentration of said at least one surfactant is between 1% and 10% (w/w) of the total weight of the precursor solution. In some embodiments, the concentration is between 1% and 5%. In other embodiments, the concentration is between 1% and 3%. In other embodiments the concentration is between 1% and 2%. In still further embodiments, the surfactant concentration is 1.6% (w/w).

There is thus provided a process for the preparation of a conductive nanowire film on a surface of a substrate, said process comprising:

(a) obtaining an aqueous precursor solution, said solution being prepared by:
  (i) forming a solution of at least one surfactant at a concentration of between 1-10% (w/w), at least one gold metal precursor and at least one silver metal precursor and at least one ascorbate reducing agent in an aqueous medium;
  (ii) adding a metal borohydride;
(b) forming a thin-film of the solution of step (a) on at least a portion of a surface of a substrate; and
(c) allowing said thin-film to dry;
thereby obtaining a gold/silver nanowire film on at least a portion of said surface.

The at least one surfactant employed with this process of the invention, is as defined hereinabove.

In some embodiments of all processes of the invention, the at least one surfactant is one comprising at least one quaternary ammonium group.

The invention also provides a kit comprising, in the same container or in different containers, at least one metal precursor, at least one surfactant and at least one reducing agent, optionally a liquid medium (such as water), means to permit dissolution of each of the components of the kit in each other or in the medium, and instructions to prepare a precursor solution. Where two or more metal precursors are to be used, the kit may comprise each in a separate container.

As used herein, the process, the precursor solution or the kit of the invention may include additional steps or ingredients or parts, only if the additional steps, ingredients, or parts do not alter the basic and novel characteristics of the claimed process, solution and kit.

As used herein, the singular form "a", "an" and "the" include plural references unless the context clearly dictates otherwise. For example, the term "a metal precursor" or "at least one metal precursor" may independently include a plurality of metal precursors, including mixtures thereof.

As used herein, the term "metal nanowire" refers to a continuous metallic wire comprising one or more elemental metal, a metal alloy thereof and, in some embodiments, a metallic compound, e.g., a metal oxide thereof. The cross sectional diameter of the metal nanowire is less than 100 nm. In some embodiments, the cross-sectional diameter is less than 50 nm, in other embodiments less than 10 nm and in further embodiments the diameter is between 2-10 nm, or 2-9 nm, or 2-8 nm, or 2-7 nm, or 2-6 nm, or 2-5 nm, or 2-4 nm, or 3-5 nm.

The metal nanowire has an aspect-ratio (the ratio of length of the nanowire to its width) greater than 100, in some embodiments greater than 500, and further embodiments greater than 1000. As used herein, "high aspect ratio" refers to an aspect ratio above 100.

In some embodiments, the metal nanowires are of a metal selected from gold, silver, copper, nickel, palladium or combinations thereof. In some other embodiments, the metal nanowires are of gold and silver.

As stated above, the process of the invention provides for the preparation of a nanowire film which comprises a plurality of such metal nanowires. In some embodiments, the nanowire film comprises a plurality, i.e., at least two, metal nanowires arranged in the film as separate nanowires randomly distributed and having a random spatial arrangement, and/or in groups or bundles of two or more nanowires, with each nanowire in the bundle substantially having the same spatial arrangement and direction. The independent nanowires or bundles thereof may also take on the form of a mesh, namely a formation of closely spaced and randomly crossing metal nanowires, said mesh being conductive throughout, namely at any two arbitrary points thereof.

Since the nanowire film comprises of a sufficient number of metal nanowires, electrical conductivity is observed with electrical charge percolation from one metal nanowire to another. The nanowire film has thus electrical conductivity.

As one versed in the art would recognize, the conductivity referred to is a metallic electrical conductivity or ohmic electrical conductivity, i.e., exhibiting linear current/voltage curves. In some embodiments, the film conductivity does not exceed 1000 Ohm square.

The nanowire film additionally has high transparency to light due to the low volume filling of the metal in the film, namely the occupation of overall only a small surface area by the nanowires. The nanowire film is transparent between 400-800 nm. In some embodiments, the light transmission of the nanowire film is at least 75% and can be as high as 98%. In some further embodiments, the transmission is between 75-85%.

The metal nanowires and the conductive nanowire films of the invention may be fabricated into substantially any device that can utilize such nanostructures or articles associated therewith. Such nanostructures and articles of the invention can be used in a variety of applications, such as sensors (such as electrochemical sensors, mechanical sensors, electromechanical sensors), tags or probes, electrodes (such as transparent electrodes), switches, transistors, displays, photovoltaic cells and other opto-electronic devices.

The structural, chemical and electronic properties of the specific metal nanowire or film may be used in the design and manufacture of a variety of such devices. For some applications, the metal nanowires or films are integrated into a functional component of a device for use, in some non-limiting examples, in surface-enhanced Raman scattering, subwavelength optical waveguiding, biolabeling, and biosensing, particularly where the nanowires of composed or gold and/or silver metals.

For other applications, the metal nanowires of the invention and the film comprising same, may be further functionalized to impart to the film certain surface properties. Functionalization of the conductive nanowire film of the invention may be through functionalization of the metal nanowires or through functionalization of the exterior surfaces of the film.

The invention thus provides an electrode structure comprising an electrically conductive film comprising a plurality of electrically conductive nanowires on a substrate, which may or may not be optically transparent. In some embodiments, the electrode structure is configured as a photocathode. In other embodiments, the substrate is optically transparent. The film comprising said plurality of electrically conductive nanowires according to the invention may be a portion of a substrate.

The invention further provides a photocathode structure comprising an optically transparent substrate carrying a layer formed by an arrangement (e.g., a mesh) of the conductive nanowires.

An optically transparent electrode is also provided, said electrode comprising a conductive layer, according to the invention, formed by an arrangement of the conductive nanowires on an optically transparent substrate.

The invention also provides an electronic device comprising an electrodes' assembly wherein at least one of the electrodes comprises a conductive layer comprised of an arrangement of conductive nanowires according to the invention on a substrate. In some embodiments, the electronic device is configured and operable as a marker (e.g., unique random pattern of wires having unique distribution/profile of electric and/or magnetic field along the substrate); a sensor (photodetector); a switch (transistor) and other related devices. The electrodes' assembly may be selected from a diode, triode, transistor, etc.

There is thus provided a transistor device wherein at least one of source, drain and gate electrodes comprises the electrically conductive layer of the conductive nanowires of the invention, on a substrate.

A transistor device is also provided, wherein the device comprises a gate on insulator structure having an electrically insulating substrate carrying a conductive layer of electrically conductive nanowires according to the invention.

The present invention also provides an electroluminescent screen device comprising a luminescent substrate structure carrying a layer of conductive nanowires according to the invention.

For some applications it may be necessary to embed the nanowire film in a solid matrix, with portions of the nanowires extending from the matrix to enable access to a conductive network. Such a matrix may provide protection to the nanowires from adverse factors such as corrosion and abrasion. The matrix may also offer mechanical properties to the conductive nanowire layer.

Additionally, performance-enhancing layers may be used to further enhance the characteristics of the nanowire film. This, for example, may be achieved by introducing additional layers in the transparent conductor structure of the invention. Thus, in other embodiments, the invention also provides a multi-layer transparent conductor which comprises the conductive nanowire film of the invention and at least one additional layer selected from an anti-reflective layer, an anti-glare layer, an adhesive layer, a barrier layer, and a protective coat.

The invention thus provides a transparent conductor comprising a substrate and a conductive film on at least a portion of a surface of said substrate, the conductive film comprising a plurality of metal nanowires as disclosed herein, and optionally at least one performance enhancing layer, as disclosed.

In some embodiments, the nanowire conductive film is used for multiple conductors in an integrated circuit chip.

For certain applications, the nanowire film may be treated, during manufacture or after it has been formed with a polymeric surfactant such as a cationic polymeric surfactant, so as to endow the nanowires or the film as a whole with increased physical stability. In some embodiments, the polymeric surfactant is poly-diallyldimethylammonium chloride. Alternatively, polymerizable monomers, such as styrene, that can be polymerized after film drying and nanowire formation using a polymerization initiator solution may be employed.

It should be appreciated that certain embodiments of the invention, which are, for clarity, described as distinct embodiments, may also be provided in combination in a single embodiment. Conversely, various features of the invention, which are, for brevity, described in the context of a single embodiment, may also be provided separately or in any suitable combination or as suitable in any other described embodiment of the invention.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 5A-5D are TEM images of nanowire films deposited on carbon coated grids:

FIGS. 5A-5B show TEM obtained from 0.25 M CTAB solution. The inset in FIG. 5A shows the uniformity of the nanowire film over a macroscopic area (>100 μm² area).

FIGS. 5C-5D show TEM obtained from 0.6 M CTAB solution. The inset in FIG. 5C shows a case where silver ion concentration was too low relative to the CTAB 0.6 M concentration and the small nucleated segments could not connect.

FIG. 6 shows a SEM image of a part of a nanowire film prepared on a silicon substrate and washed with 70% ethanol.

FIGS. 7A-7D show SEM image of nanowire bundle, a typical measurement configuration and current-voltage curves:

FIG. 7A shows the current-voltage measurement for the SEM image shown in FIG. 7B of nanowire bundle conductance measurement using clean tungsten nanoprobes in the Zyvex S100 system.

FIG. 7C shows a typical measurement configuration with the nanowire film deposited on a pre-patterned silicon substrate with gold electrodes.

FIG. 7D shows current-voltage curves measured with various inter-electrode spacings as indicated in the legend.

FIG. 8A shows a visible light transmission curve of a nanowire film deposited on a fused silica substrate with a sheet resistance of 200 Ω/sq.

FIG. 8B demonstrates bending of a PET substrate coated with a nanowire film to a curvature radius of ~1.5 cm maintains a ~100 Ω/sq sheet resistance.

FIG. 8C displays the periodic table as observed through the same PET film which had ~80-85% optical transmission in the visible range. The bright stripes are silver paint lines used to estimate the sheet resistance. The upper right corner is film-free.

DETAILED DESCRIPTION OF EMBODIMENTS

General Experimental Procedures

Figure 1A:
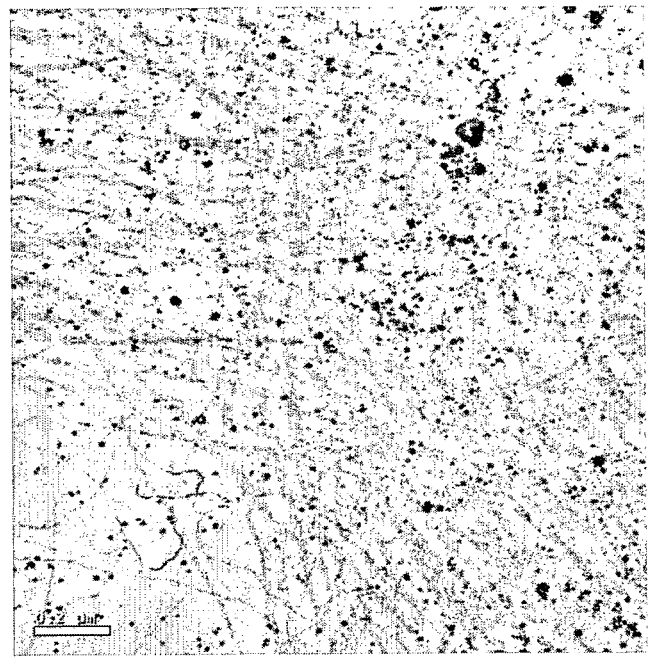
FIGS. 1A-1B are transmission electron microscope (TEM) images of a dried growth solution containing 7.5% CTAB deposited on a carbon coated copper grid after washing most of the CTAB with water and ethanol.

The preparation of a high aspect-ratio metal nanowire mesh films with high conductivity, flexibility and transparency was based on an in-situ formation of the nanowires which occurred after the deposition of a thin film of precursor solution on top of a substrate of choice.

Gold-silver nanowires were grown in a drying thin film containing a high cationic surfactant concentration which formed a liquid-crystalline template phase for the formation of a nanowire network. The nanowire network films were uniform over macroscopic (cm$^2$ scale) areas and on a variety of substrates. These films, measuring only few nanometers in thickness were characterized by low sheet resistivities, in the range of 60-300 Ω/sq, as formed, and a high transparency, comparable to indium tin oxide (ITO) films.

One process for the preparation of the metal nanowire mesh films begins with the preparation of a relatively concentrated surfactant solution having at least 5%, or at least 7.5%, or from 5% to 30%, or from 5% to 21%, or from 7.5% to 21% (w/w) of a surfactant such as cetyltrimethylammonium bromide (CTAB) in ultrapure water. The formerly published process [9, 10] had only 1.6% CTAB. Such high concentrations require heating of the solution so as to produce a uniform micro-emulsion phase of the surfactant/water mixture.

A solution of chloroauric acid was added to this emulsion to yield a final Au precursor concentration of between 1 and 4 mM and a higher concentration of sodium ascorbate was added at a concentration of 40 to 60 times higher than the gold concentration. The initiation of the metal deposition process occurred by adding a concentrated AgNO$_3$ solution to the prepared solution at 30-40° C., while stirring, to a final silver concentration 2 times higher than that of the gold. The silver ions added were being reduced by the ascorbate ions and when small silver metal seeds formed, the reduction of gold ions by the ascorbate was catalyzed and the metal nanostructures began growing. Immediately after silver addition a thin-film of the solution was spread on the substrate of choice either by drop casting, dip-coating or spin-coating. The thickness of such a film depended on the viscosity (determined by surfactant concentration and temperature) and the spread conditions and was measured to be between 10 and 100 Next, the film was dried, in some cases by placing the substrate under mild heating by a lamp at 35-40° C. until the film fully dried, after about 10 minutes.

For microscopy studies of the dried films, most of the surfactant was washed out with various solvents. For conductance measurements, a quick ethanol wash was sufficient to allow for good electrical contact, either to pre-fabricated electrodes patterned on the substrate or to electrodes patterned post-film-deposition, either by metal evaporation or by spreading silver paint on the film.

In another process according to the invention, the aqueous solution was first formed by preparing a relatively concentrated surfactant solution having at least 5%, or at least 7.5%, or from 5% to 30%, or from 5% to 21%, or from 7.5% to 21% (w/w) of a surfactant such as cetyltrimethylammonium bromide (CTAB) in ultrapure water. A solution of chloroauric acid was added to this emulsion together with a concentrated AgNO$_3$ solution, while stirring, to a final silver concentration 2 times higher than that of the gold. After a few minutes, a solution of sodium borohydride was added followed by a solution of sodium ascorbate. The silver and gold ions in the presence of the strongly reducing agent began undergoing reduction, forming silver/gold metal seeds, the reduction of gold and silver ions by the ascorbate was catalyzed and the metal nanostructures began growing.

Example 1

A 8.3% (w/w) cetyltrimethylammonium bromide (CTAB) solution was prepared by heating and stirring the CTAB/water mixture at 50° C. for 5 minutes. To this solution, at 40° C., 500 μL of 25 mM HAuCl$_4$ solution and 425 μL of 1.8 M freshly prepared sodium ascorbate solution were added and stirred together. Then, 250 μL of 100 mM AgNO$_3$ solution were added while stirring. The final CTAB concentration in the nanowire growth solution was ~7.5%. 30 seconds after the addition of the Ag solution, the stirring was discontinued and the solution was deposited on a substrate and let dry for 15-45 minutes at 35-40° C.

Figure 1B:
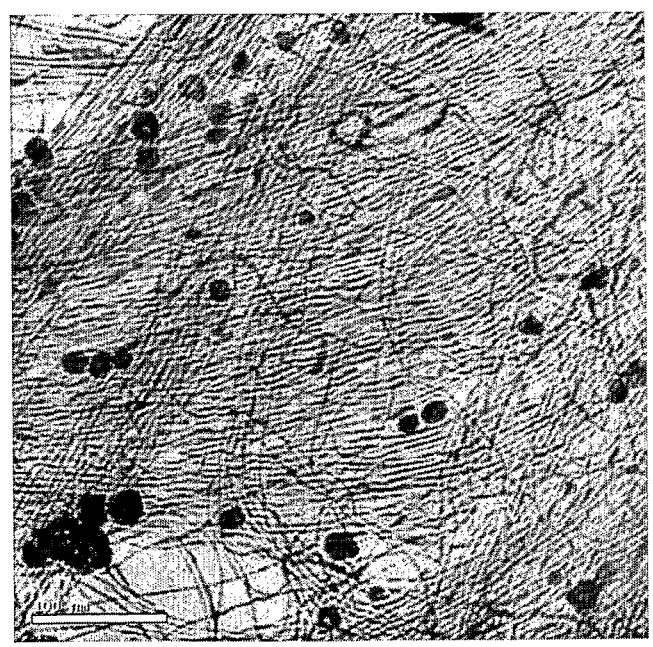
Figure 2A:
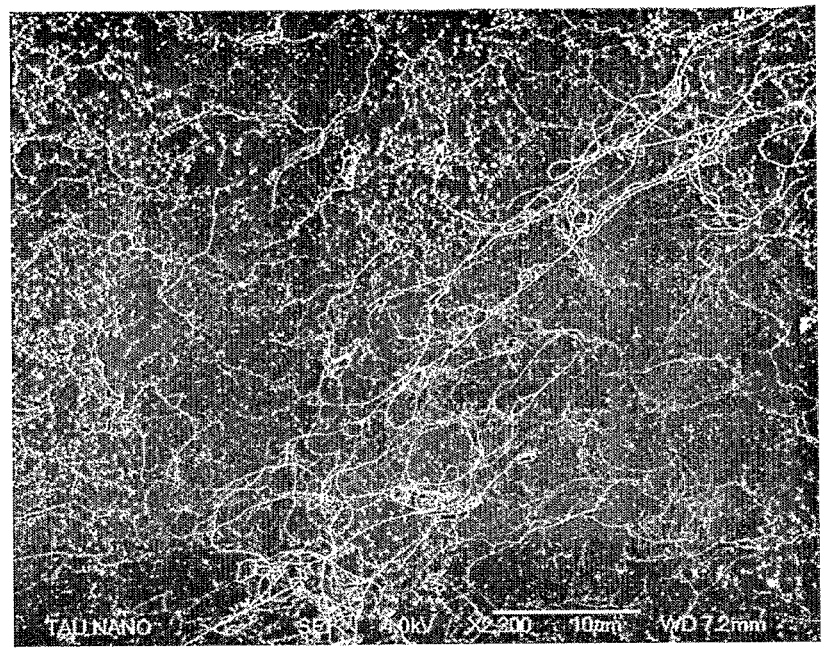
FIGS. 2A-2B are scanning electron microscope (SEM) images of thin-films prepared from the 7.5% growth solution deposited on (FIG. 2A) fused silica and (FIG. 2B) Si with native oxide 10×10 mm substrates.
Figure 2B:
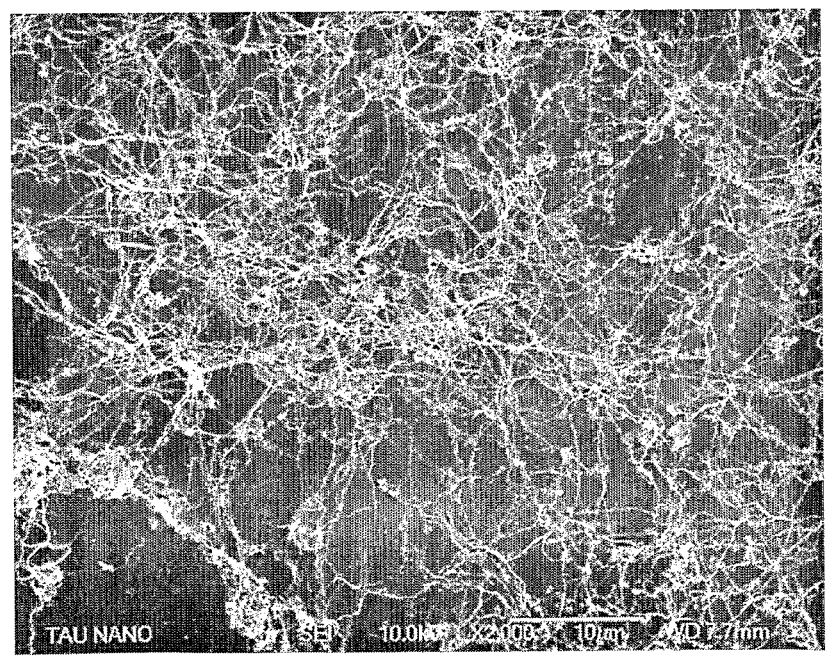

Transmission electron microscopy (TEM) and scanning electron microscopy (SEM) imaging revealed metal nanowire networks of varying wire densities and entanglement, depending on the exact solution and deposition conditions, uniformly spread over the substrates (See, FIGS. 1A to 1B showing transmission electron microscope images, and FIGS. 2A to 2B showing scanning electron microscope images). The nanowires were typically 3-5 nm wide and many micrometers long and in this case composed of 85-90% gold and 15-10% silver. A varying amount of non-elongated metal nanostructures was also observed. The minimization of the concentration of such structures in the films was a key to improving their optical transmission.

Nanowire films were obtained from solutions that had up to 21% CTAB concentrations, 5 mM HAuCl$_4$, 0.2M sodium ascorbate and 10 mM AgNO$_3$. These concentrated CTAB solutions were highly viscous and required longer mixing and heating times to prepare homogeneous solution thereof. With such growth solutions it was easy to coat the substrates by simple dip-coating.

The composition of the substrate did not influence the final results since the high surfactant concentration ensured proper wetting of either hydrophobic or hydrophilic surfaces. So far, the process produced similar results on silicon, fused silica, polycarbonate and carbon substrates. Differences between various substrates were mostly due to edge effects of the drying film which were more substantial in cases of small substrates such as TEM grids. The high level of uniformity and thus nanowire percolation, as seen in FIGS. 1A to 1B and 2A to 2B could not be obtained using the procedure described in the art [e.g., in refs. 9 and 10].

Figure 3:
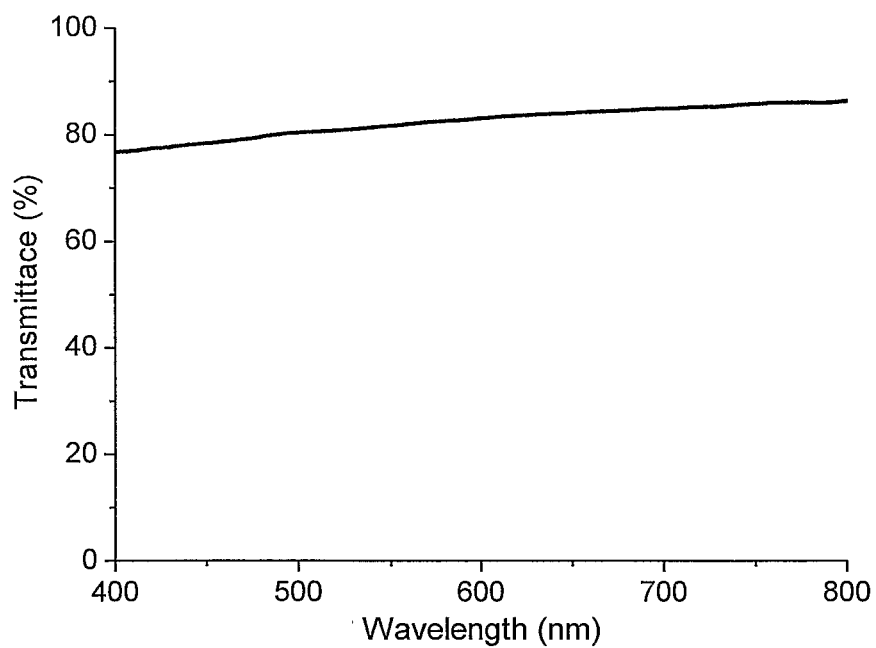
FIG. 3 presents a visible light transmission curve of a film deposited from a 7.5% CTAB solution on a fused silica substrate. This film had a ~500 Ωsq resistance.

Electrical measurements, done on several length scales at various arbitrary positions on the substrates using various types of contacts have shown ohmic conductance of the order of 100-500 Ω/sq and 75-85% transmittance in the visible range (FIG. 3), which is comparable to indium tin oxide (ITO) films. The estimated conductivity per Au/Ag wire was of the order of bulk gold conductivity. It should be noted that a significant part of the ~20% extinction observed in these experiments came from light scattering that the simple spectrophotometer used for these measurements could not collect, while in a thin-film photovoltaic device most of the scattered light would be collected. Thus, the total transmitted light was probably significantly higher than the observed average ~80%.

Figure 4:
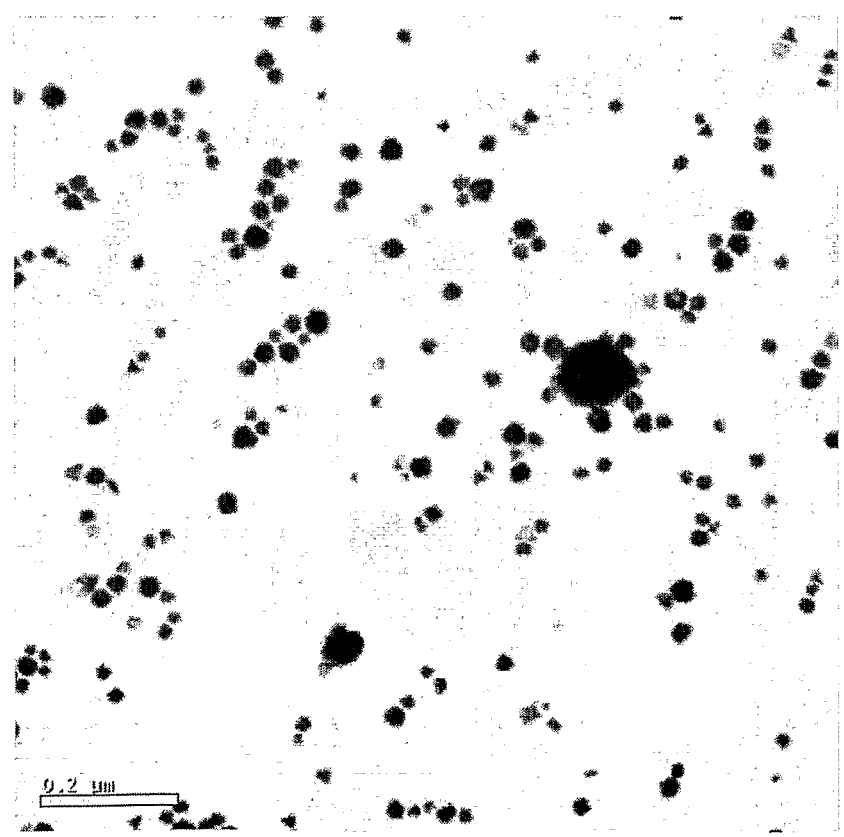
FIG. 4 depicts a film prepared according to a process of the art.

Contrary to the metal nanowire films prepared by the processes of the invention, films prepared by the methods of the art, particularly those described in references [9 and 10] do not result in the formation of mesh film arrangements of the type observed in FIGS. 1A to 1B and disclosed herein. In fact, and as FIG. 4 demonstrates, the previously published procedure typically yield a film of spherical nanoparticles rather than a film of nanowires on scaling up surfactant and reagent concentrations. The process of the invention reproducibly yields metal nanowire films.

Example 2

A solution comprising surfactant cetyltrimethylammonium bromide (CTAB), chloroauric acid, as a gold precursor at a molar ratio of 1:200 relative to the CTAB concentration, and sodium ascorbate, at a molar ratio of 60:1 relative to the gold concentration, was prepared. The nanowire growth solutions had CTAB concentrations of 0.25 M and 0.6 M, significantly higher than the 0.1 M used by Murphy [12]. In addition, the growth solution contained a relatively high concentration of silver nitrate, twice the concentration of the Au(III) ions. When the four components were mixed together at 35° C. the gold ions were reduced to the colorless Au(I) state, forming a $[AuX_2]^-$-$CTA^+$ complex (x=Cl, Br) but further reduction to the metallic state required the addition of catalytic metal seed particles. Similarly, the silver ions formed an AgBr-CTAB complex.

As an alternative, a small amount of sodium borohydride dissolved in water (e.g., 0.001-0.0001%) was added to the precursor solution in order to initiate metal reduction in this solution. The borohydride amount was enough to reduce up to 0.02% of the metal ions to form small metallic seed particles which catalyzed the reduction of the rest of the metal ions by the ascorbate. Immediately after the borohydride addition, the solution was deposited as a thin film, ~100 μm thick, on the substrate of choice that was kept at ~35° C. and a relative humidity of ~50% for drying. The viscosity of the deposited solution at 35° C. was ~2 cP for the 0.25 M CTAB solution and ~100 cP for the 0.6 M CTAB solution.

FIGS. 5A to 5D display the results of drying the thin growth solution films on transmission electron microscopy (TEM) carbon coated grids for samples prepared with two CTAB concentrations: 0.25M and 0.6M. FIGS. 5A to 5B show TEM obtained from 0.25M CTAB solution. It may be noted that a highly uniform nanowire coating appeared across the 3 mm diameter grid for the 0.25 M CTAB sample. Most of the nanowires appeared in wavy bundles with characteristic bundle size of ~20 wires, in the case of the 0.25 M CTAB sample and thicker nanowire domains for the 0.6 M CTAB sample (FIG. 5C). The high magnification image (FIG. 5D) provides more quantitative information about the structure of the nanowire bundles; Average nanowire diameters are in the range 2-2.5 nm, and inter-wire spacing is ~2.5 nm, which is significantly smaller than the 3.9 nm estimated for a CTAB bilayer covering thicker gold nanorods [13]. This difference may be due to a larger radius of curvature around the ultra-thin nanowires of the invention, which would lead to a different bilayer packing. Thus, it appears that the metal was deposited at locally ordered surfactant mesostructure domains that were previously found to have liquid-crystalline characteristics, probably close to a reverse hexagonal phase. The nanowire bundle density and morphology varied with deposited solution thickness, drying temperature and drying rate (by control of relative humidity). One of the important parameters was the initial surfactant concentration; when it was increased to about 0.6 M the liquid crystalline domains were thicker than those formed at lower concentrations (FIG. 5C), but also with a larger number of spherical particles that were apparently formed out of the tubular mesostructures. In the case of the higher CTAB concentration the formed metal mesostructures bear a closer resemblance to the oxide based mesoporous materials.

A closer inspection of a sample with high surfactant concentration (0.6 M) and relatively low silver concentration (4 mM, relative to the usual 6 mM) revealed regions with discontinuous, segmented nanowires (inset of FIG. 5C) with typical segment size and separations of the order of few nm up to ~30 nm. Accordingly and without wishing to be bound by theory the nanowire formation process began in a large number of small metal clusters triggered by the borohydride addition. These small metal particles were apparently caught within the surfactant template structure as the film became progressively more concentrated on drying. While drying, additional metal atoms deposited on the seeds through catalytic reduction of the metal ions by ascorbate ions. It has been previously shown for mesostructured silica that regions of the mesophase ordered parallel to the interface were induced by proximity to the interface, as also appears to be the case in the present invention.

The processes of the invention may be performed using various different substrates such as silicon, quartz and polyethylene terphtalate (PET). FIG. 6 displays a scanning electron microscope (SEM) image of the film as disclosed herein above deposited on a silicon substrate after gentle washing with 70%/30% ethanol/water solution. In this case it was not possible to resolve individual nanowires and only whole bundles of the CTAB coated nanowires were observable.

Conductance measurements of the nanowire films were performed on various length scales. For example, FIGS. 7A-7D show SEM images of nanowire bundle, a typical measurement configuration and current-voltage curves. FIG. 7A shows the current-voltage measurement for the SEM image shown in FIG. 7B of nanowire bundle conductance measurement using clean tungsten nanoprobes in the Zyvex S 100 system. FIG. 7C shows a typical measurement configuration with the nanowire film deposited on a pre-patterned silicon substrate with gold electrodes. FIG. 7D shows current-voltage curves measured with various inter-electrode spacings as indicated in the legend. On the smallest scale, sharp tungsten probes (500 nm in diameter) were used in a Zyvex 8100 nanomanipulator system to probe individual nanowire bundles in situ, while imaging with the SEM, as shown in FIG. 7 A. In order to avoid large contact resistance the tungsten probes were chemically cleaned in KOH solution followed by in-situ oxidation removal process in the SEM, which resulted in a probe-to-probe resistance of the order of 10Ω. In addition, the substrate with the deposited nanowires was thoroughly washed with 70%/30% ethanol/water and shortly exposed to low-power oxygen plasma, which removed part of the nanowire film in addition to the surfactant coating. The current-voltage curves of the nanowire bundles were ohmic with typical resistance values of the order of 1 kΩ/μm. Several measurements on isolated nanowire bundles as the one shown in the inset of FIG. 7A were performed. Assuming an average bundle of 20 nanowires and a diameter of 2.5 nm, an estimated nanowire resistivity of the order of $10^{-7}$ Ωm was obtained, which is about 4 times the resistivity of bulk gold. Considering the roughness of the estimate and possible probe-wire contact resistance, this result is roughly consistent with bulk gold like nanowire resistivity.

In addition, the films were deposited over Si wafers with a 100 nm thick oxide layer and gold electrodes patterned on top with inter-electrode 2-20 µm gaps (FIG. 7B). The bundle resistances measured over these gaps, together with the bundle densities apparent in the SEM images, were used to estimate effective sheet resistances that were in the range of 100-300 Ω/sq. They also exhibited an ohmic behavior down to 4 K. Rough estimates of nanowires' width and length, connecting the micro-electrodes provided wire resistivities which are of the same order as bulk gold (~$10^{-8}$ Ωm). This indicates that at least part of the nanowires grown within the CTAB meso-structures were formed at the bottom of the dried CTAB film, forming good electrical contact with the pre-formed gold electrodes. Optical dark field microscopy confirmed that the nanowire bundles were located at the bottom of the ~5-10 µm thick dried CTAB films.

Furthermore, the nanowire films were deposited on a 1 cm² fused silica substrates (also from 0.6 M CTAB), silver paint was applied in two parallel lines at the edges of the substrate and sheet resistances of the order of 100 Ω/sq were measured after mild ethanol washing. In particular, the high flexibility of the film was demonstrated (FIG. 8B) where only up to 10% increase in the ~100 Ω/sq sheet resistance occurred for a film deposited on a PET substrate which was bended with a curvature radius of ~1.5 cm. Upon relaxing the bend in the film the sheet resistance returned to its exact original value, demonstrating the high flexibility of the nanowire film. The films deposited on PET have shown the lowest resistivity results, down to ~60 Ω/sq.

Figure 8A:
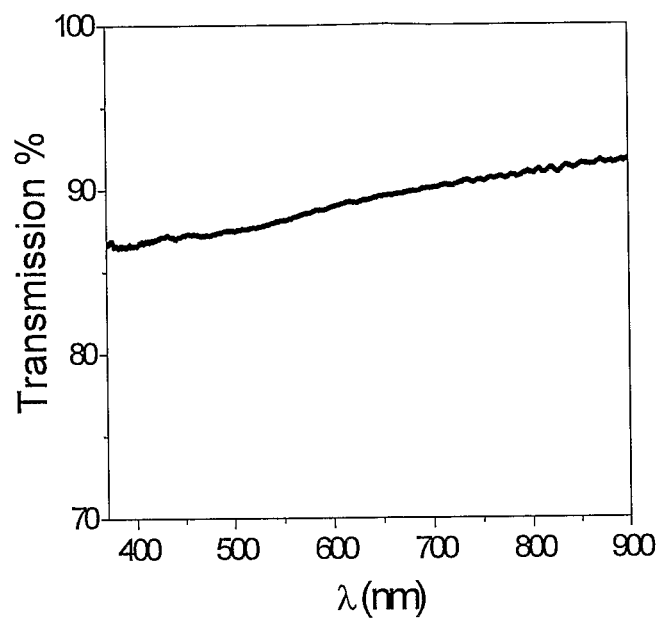
FIGS. 8A-8C show visible light transmission curve of a nanowire film, bending of PET substrate coated with a nanwire film and the periodic table as observed through the PET film.
Figure 8B:
Figure 8C:
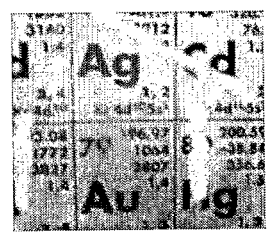

FIGS. 8A-8C show visible light transmission curve of a nanowire film, bending of PET substrate coated with a nano wire film and the periodic table as observed through the PET film. FIG. 8A shows a visible light transmission curve of a nanowire film deposited on a fused silica substrate with a sheet resistance of 200 Ω/sq. FIG. 8B demonstrates bending of a PET substrate coated with a nanowire film to a curvature radius of ~1.5 cm maintains a ~100 Ω/sq sheet resistance. FIG. 8C displays the periodic table as observed through the same PET film which had ~80-85% optical transmission in the visible range. The bright stripes are silver paint lines used to estimate the sheet resistance. The upper right corner is film-free.

The optical extinction of the films was measured using a standard spectrophotometer. A transmission curve for a film with relatively high transparency and sheet resistance of 200 Ω/sq is presented in FIG. 8A. Typical far-field transmission of all samples was in the range of 80-90%. This extinction contained a large scattering component which, in the case of photovoltaic devices, may be collected within the device. Without wishing to be bound by theory, the varying amounts of residual spherical particles, which had relatively large diameters relative to the nanowires, may be responsible for a substantial part of the extinction.

Example 3

As recited above, in some experiments, prior to the addition of the reducing agent (e.g., sodium ascorbate) to the Au precursor solution, the silver solution was added to the Au precursor solution and only then the mild reducing agent e.g., sodium ascorbate was added. Under such conditions no metal reduction was induced. Subsequently, low concentration (e.g., 1/100 of that of the sodium ascorbate or lower) of a stronger reducing agent with respect to ascorbate was added to the solution. Such stronger reducing agent should have a reduction potential($E^0$) of −0.5 V or more negative. Non-limiting examples are sodium borohydride, sodium cyanoborohydride and hydrazine. The addition of the strong reducing agent initiated metal reduction in this solution and subsequent metal deposition on the substrate.

The invention claimed is:

1. A process for the preparation of a conductive nanowire film on a surface of a substrate, wherein the aspect ratio of the nanowires is greater than 1000 and the cross-sectional diameter of the nanowires is less than 10 nm, said process comprising:
   (a) obtaining an aqueous precursor solution comprising at least one metal precursor, at least one surfactant and at least one metal reducing agent wherein the concentration of the at least one surfactant in said solution is at least 5% (w/w), wherein the metal precursor is selected from metal precursor in a form of metal ions or in a form which under the reaction conditions dissociate into metal ions;
   (b) after obtaining the precursor solution, placing the precursor solution on the surface of a substrate, forming a film of the precursor solution on at least a portion of the surface of the substrate; and
   (c) allowing said nanowires to form in said film;
thereby obtaining a conductive nanowire film on at least a portion of said surface.

2. The process according to claim 1, further comprising irradiating the film of the precursor solution on at least a portion of a surface of a substrate with ultraviolet radiation.

3. The process according to claim 1, wherein said aqueous precursor solution is prepared by first forming a solution of at least one first metal precursor and at least one surfactant at a temperature allowing dissolution followed by the addition of at least one metal reducing agent and/or at least one second metal precursor.

4. The process according to claim 3, wherein said aqueous precursor solution is prepared by first forming a solution of at least one first metal precursor, at least one surfactant and at least one metal reducing agent at a temperature allowing dissolution followed by the addition of at least one second metal precursor.

5. The process according to claim 3, wherein said aqueous precursor solution is prepared by first forming a solution of at least one first metal precursor, at least one surfactant and at least one second metal precursor and at least one reducing agent at a temperature allowing dissolution, followed by the addition of at least one second reducing agent.

6. The process according to claim 5, wherein said at least one second metal precursor is a silver metal precursor.

7. The process according to claim 1, wherein said at least one metal precursor is selected from the group consisting of gold metal precursors, silver gold precursors, palladium metal precursors, copper metal precursors, nickel metal precursors and platinum metal precursors.

8. The process according to claim 7, wherein said at least one metal precursor is selected from the group consisting of $HAuCl_4$; $AgNO_3$; $(NH_4)_2PdCl_6$; $Cu(NO_3)_2$; $NiCl_2$; and $H_2PtCl_6$.

9. The process according to claim 7, wherein said at least one metal precursor is at least one gold metal precursor.

10. The process according to claim 1, wherein said at least one surfactant is at least one cationic surfactant.

11. The process according to claim 10, wherein said at least one cationic surfactant comprises at least one quaternary ammonium group.

12. The process according to claim 11, wherein said at least one surfactant is selected from the group consisting of cetyltrimethylammonium bromide (CTAB), didodecyldimethylammonium bromide, tetradecyltrimethylammonium bromide, didecyldimethylammonium bromide, wherein the bromide counterion, alternatively, may be a chloride or an iodide.

13. The process according to claim 1, wherein said at least one metal reducing agent is selected from the group consisting of inorganic and organic reducing agents.

14. The process according to claim 13, wherein said at least one reducing agent is selected from the group consisting of metal borohydride, metal ascorbate, hydroquinone and hydroquinone derivatives, hydrazine and hydrazine derivatives and any combination thereof.

15. The process according to claim 14, wherein said metal borohydride and metal ascorbate are sodium borohydride and sodium ascorbate, respectively.

16. The process according to claim 1, wherein the thickness of the thin-film is between 10 and 100 μm.

17. The process according to claim 1, wherein the aqueous precursor solution in step (a) being prepared by combining the at least one surfactant, the at least one metal precursor being at least one first metal precursor, the at least one metal reducing agent, and at least one second metal precursor in an aqueous medium.

18. The process according to claim 17, wherein the reduction of the at least one first metal precursor is induced by the addition of the at least one second metal precursor.

19. The process according to claim 18, wherein said at least one second metal precursor is a silver metal precursor.

20. The process according to claim 17, wherein said at least one first metal precursor is a gold metal precursor and the aqueous precursor solution is obtained by:
  (i) forming a solution of at least one surfactant, at least one gold metal precursor and at least one metal reducing agent in an aqueous medium; and
  (ii) adding into the aqueous solution the at least one second metal precursor, wherein the at least one second metal precursor is at least one silver metal precursor to thereby induce reduction of said at least one gold metal precursor.

21. The process according to claim 17, wherein said at least one metal reducing agent is sodium ascorbate and said at least one surfactant is CTAB.

22. The process according to claim 1, wherein
  in the obtaining the aqueous precursor solution, said solution being prepared by:
    (i) combining the at least one surfactant, the at least one first metal precursor, at least one second metal precursor and the at least one metal reducing agent in an aqueous medium, wherein the at least one metal precursor and the at least one second metal precursor are each, independently selected from metal precursors in a form of metal ions or in a form which under the reaction conditions dissociate into metal ions; and
    (ii) introducing at least one second reducing agent.

23. The process according to claim 22, wherein the reduction of the at least one first metal precursor is induced by the at least one second reducing agent after a solution has been formed of the first and second metal precursors, first reducing agent and the at least one surfactant.

24. The process according to claim 22, wherein the at least one reducing agent and the at least one second reducing agent employed are a hydride or a metal borohydride and sodium ascorbate.

25. The process according to claim 22, wherein the at least one first metal precursor is a gold metal precursor and the at least one second metal precursor is silver.

* * * * *